(12) United States Patent
Colloca et al.

(10) Patent No.: US 11,190,880 B2
(45) Date of Patent: Nov. 30, 2021

(54) DIAPHRAGM ASSEMBLY, A TRANSDUCER, A MICROPHONE, AND A METHOD OF MANUFACTURE

(71) Applicant: Sonion Nederland B.V., Hoofddorp (NL)

(72) Inventors: Michele Colloca, Hoofddorp (NL); Gert-Jan van der Beek, Hoofddorp (NL)

(73) Assignee: Sonion Nederland B.V., Hoofddorp (NL)

( * ) Notice: Subject to any disclaimer, the term of this patent is extended or adjusted under 35 U.S.C. 154(b) by 18 days.

(21) Appl. No.: 16/728,577

(22) Filed: Dec. 27, 2019

(65) Prior Publication Data

US 2020/0213740 A1 Jul. 2, 2020

Related U.S. Application Data

(63) Continuation-in-part of application No. 16/725,469, filed on Dec. 23, 2019, now abandoned.

(30) Foreign Application Priority Data

Dec. 28, 2018 (EP) .................................... 18248154

(51) Int. Cl.
*H04R 7/12* (2006.01)
*H04R 7/10* (2006.01)
(Continued)

(52) U.S. Cl.
CPC ............. *H04R 7/125* (2013.01); *B81B 3/007* (2013.01); *H04R 7/10* (2013.01); *H04R 7/20* (2013.01);
(Continued)

(58) Field of Classification Search
CPC . H04R 7/125; H04R 7/10; H04R 7/20; H04R 2307/027; H04R 31/003;
(Continued)

(56) References Cited

U.S. PATENT DOCUMENTS 6,404,897 B1 * 6/2002 Devantier .............. H04R 7/125
381/426
6,788,796 B1 9/2004 Miles
(Continued)

FOREIGN PATENT DOCUMENTS

| EP | 3051841 A1 | 8/2016 |
|----|------------|--------|
| EP | 3342749 A2 | 7/2018 |

(Continued)

OTHER PUBLICATIONS

European Search Report for Application No. 18191523.2, dated Feb. 8, 2019 (8 pages).
(Continued)

*Primary Examiner* — Sunita Joshi
(74) *Attorney, Agent, or Firm* — Nixon Peabody LLP

(57) ABSTRACT

A diaphragm assembly for a miniature acoustical transducer having a sufficiently light paddle to allow good audio performance and a sufficiently stiff frame to allow handling. The paddle may be made of a thin sheet of aluminium and the frame of thicker aluminium or a bent sheet of aluminium.

19 Claims, 6 Drawing Sheets

(51) Int. Cl.
*H04R 7/20* (2006.01)
*H04R 31/00* (2006.01)
*H04R 19/04* (2006.01)
*B81B 3/00* (2006.01)

(52) U.S. Cl.
CPC .......... *H04R 19/04* (2013.01); *H04R 31/003* (2013.01); *H04R 2307/027* (2013.01)

(58) Field of Classification Search
CPC ................ H04R 10/28; H04R 2499/11; H04R 2499/15; H04R 17/005; H04R 17/025; B81B 3/007
See application file for complete search history.

(56) References Cited

U.S. PATENT DOCUMENTS

| | | | |
|---|---|---|---|
| 6,831,577 B1 | 12/2004 | Furst | |
| 6,853,290 B2 | 2/2005 | Jorgensen | |
| 6,859,542 B2 | 2/2005 | Johannsen | |
| 6,888,408 B2 | 5/2005 | Furst | |
| 6,914,992 B1 | 7/2005 | van Halteren | |
| 6,919,519 B2 | 7/2005 | Ravnkilde | |
| 6,930,259 B1 | 8/2005 | Jorgensen | |
| 6,943,308 B2 | 9/2005 | Ravnkilde | |
| 6,974,921 B2 | 12/2005 | Jorgensen | |
| 7,008,271 B2 | 3/2006 | Jorgensen | |
| 7,012,200 B2 | 3/2006 | Moller | |
| 7,062,058 B2 | 6/2006 | Steeman | |
| 7,062,063 B2 | 6/2006 | Hansen | |
| 7,072,482 B2 | 7/2006 | Van Doorn | |
| 7,088,839 B2 | 8/2006 | Geschiere | |
| 7,110,560 B2 | 9/2006 | Stenberg | |
| 7,136,496 B2 | 11/2006 | van Halteren | |
| 7,142,682 B2 | 11/2006 | Mullenborn | |
| 7,181,035 B2 | 2/2007 | van Halteren | |
| 7,190,803 B2 | 3/2007 | van Halteren | |
| 7,206,428 B2 | 4/2007 | Geschiere | |
| 7,221,767 B2 | 5/2007 | Mullenborn | |
| 7,221,769 B1 | 5/2007 | Jorgensen | |
| 7,227,968 B2 | 6/2007 | van Halteren | |
| 7,239,714 B2 | 7/2007 | de Blok | |
| 7,245,734 B2 | 7/2007 | Niederdraenk | |
| 7,254,248 B2 | 8/2007 | Johannsen | |
| 7,286,680 B2 | 10/2007 | Steeman | |
| 7,292,700 B1 | 11/2007 | Engbert | |
| 7,292,876 B2 | 11/2007 | Bosh | |
| 7,336,794 B2 | 2/2008 | Furst | |
| 7,376,240 B2 | 5/2008 | Hansen | |
| 7,403,630 B2 | 7/2008 | Jorgensen | |
| 7,415,121 B2 | 8/2008 | Mögelin | |
| 7,425,196 B2 | 9/2008 | Jorgensen | |
| 7,460,681 B2 | 12/2008 | Geschiere | |
| 7,466,835 B2 | 12/2008 | Stenberg | |
| 7,492,919 B2 | 2/2009 | Engbert | |
| 7,548,626 B2 | 6/2009 | Stenberg | |
| 7,657,048 B2 | 2/2010 | van Halteren | |
| 7,684,575 B2 | 3/2010 | van Halteren | |
| 7,706,561 B2 | 4/2010 | Wilmink | |
| 7,715,583 B2 | 5/2010 | Van Halteren | |
| 7,728,237 B2 | 6/2010 | Pedersen | |
| 7,809,151 B2 | 10/2010 | Van Halteren | |
| 7,822,218 B2 | 10/2010 | Van Halteren | |
| 7,899,203 B2 | 3/2011 | Van Halteren | |
| 7,912,240 B2 | 3/2011 | Madaffari | |
| 7,946,890 B1 | 5/2011 | Bondo | |
| 7,953,241 B2 | 5/2011 | Jorgensen | |
| 7,961,899 B2 | 6/2011 | Van Halteren | |
| 7,970,161 B2 | 6/2011 | van Halteren | |
| 8,098,854 B2 | 1/2012 | van Halteren | |
| 8,101,876 B2 | 1/2012 | Andreasen | |
| 8,103,039 B2 | 1/2012 | van Halteren | |
| 8,160,290 B2 | 4/2012 | Jorgensen | |
| 8,170,249 B2 | 5/2012 | Halteren | |
| 8,189,804 B2 | 5/2012 | Hruza | |
| 8,189,820 B2 | 5/2012 | Wang | |
| 8,223,996 B2 | 7/2012 | Beekman | |
| 8,233,652 B2 | 7/2012 | Jorgensen | |
| 8,259,963 B2 | 9/2012 | Stenberg | |
| 8,259,976 B2 | 9/2012 | van Halteren | |
| 8,259,977 B2 | 9/2012 | Jorgensen | |
| 8,280,082 B2 | 10/2012 | Van Halteren | |
| 8,284,966 B2 | 10/2012 | Wilk | |
| 8,313,336 B2 | 11/2012 | Bondo | |
| 8,315,422 B2 | 11/2012 | van Halteren | |
| 8,331,595 B2 | 12/2012 | van Halteren | |
| 8,369,552 B2 | 2/2013 | Engbert | |
| 8,379,899 B2 | 2/2013 | van Halteren | |
| 8,509,468 B2 | 8/2013 | van Halteren | |
| 8,526,651 B2 | 9/2013 | Lafort | |
| 8,526,652 B2 | 9/2013 | Ambrose | |
| 2003/0099371 A1* | 5/2003 | Ogura .................. H04R 17/00 381/426 |
| 2006/0215874 A1 | 9/2006 | Mekell | |
| 2011/0182453 A1 | 7/2011 | van Hal | |
| 2011/0189880 A1 | 8/2011 | Bondo | |
| 2011/0299708 A1 | 12/2011 | Bondo | |
| 2011/0299712 A1 | 12/2011 | Bondo | |
| 2011/0311069 A1 | 12/2011 | Ambrose | |
| 2012/0014548 A1 | 1/2012 | van Halteren | |
| 2012/0027245 A1 | 2/2012 | van Halteren | |
| 2012/0140966 A1 | 6/2012 | Mocking | |
| 2012/0155683 A1 | 6/2012 | van Halteren | |
| 2012/0155694 A1 | 6/2012 | Reeuwijk | |
| 2012/0255805 A1 | 10/2012 | van Halteren | |
| 2013/0028451 A1 | 1/2013 | de Roo | |
| 2013/0136284 A1 | 5/2013 | van Hal | |
| 2013/0142370 A1 | 6/2013 | Engbert | |
| 2013/0163799 A1 | 6/2013 | Van Halteren | |
| 2013/0195295 A1 | 8/2013 | van Halteren | |
| 2015/0222995 A1 | 8/2015 | Masashi | |
| 2015/0373456 A1 | 12/2015 | Dayton | |
| 2017/0006382 A1 | 1/2017 | Luzzato | |
| 2018/0027324 A1* | 1/2018 | Kim ....................... H04R 3/005 381/182 |
| 2018/0027325 A1* | 1/2018 | Kim ....................... H04R 1/406 381/92 |

FOREIGN PATENT DOCUMENTS

| | | | |
|---|---|---|---|
| GB | 2306075 A | 4/1997 | |
| WO | WO 2018/106999 A1 | 6/2018 | |

OTHER PUBLICATIONS

European Search Opinion for Application No. 18248154.9 (6 pages).

* cited by examiner

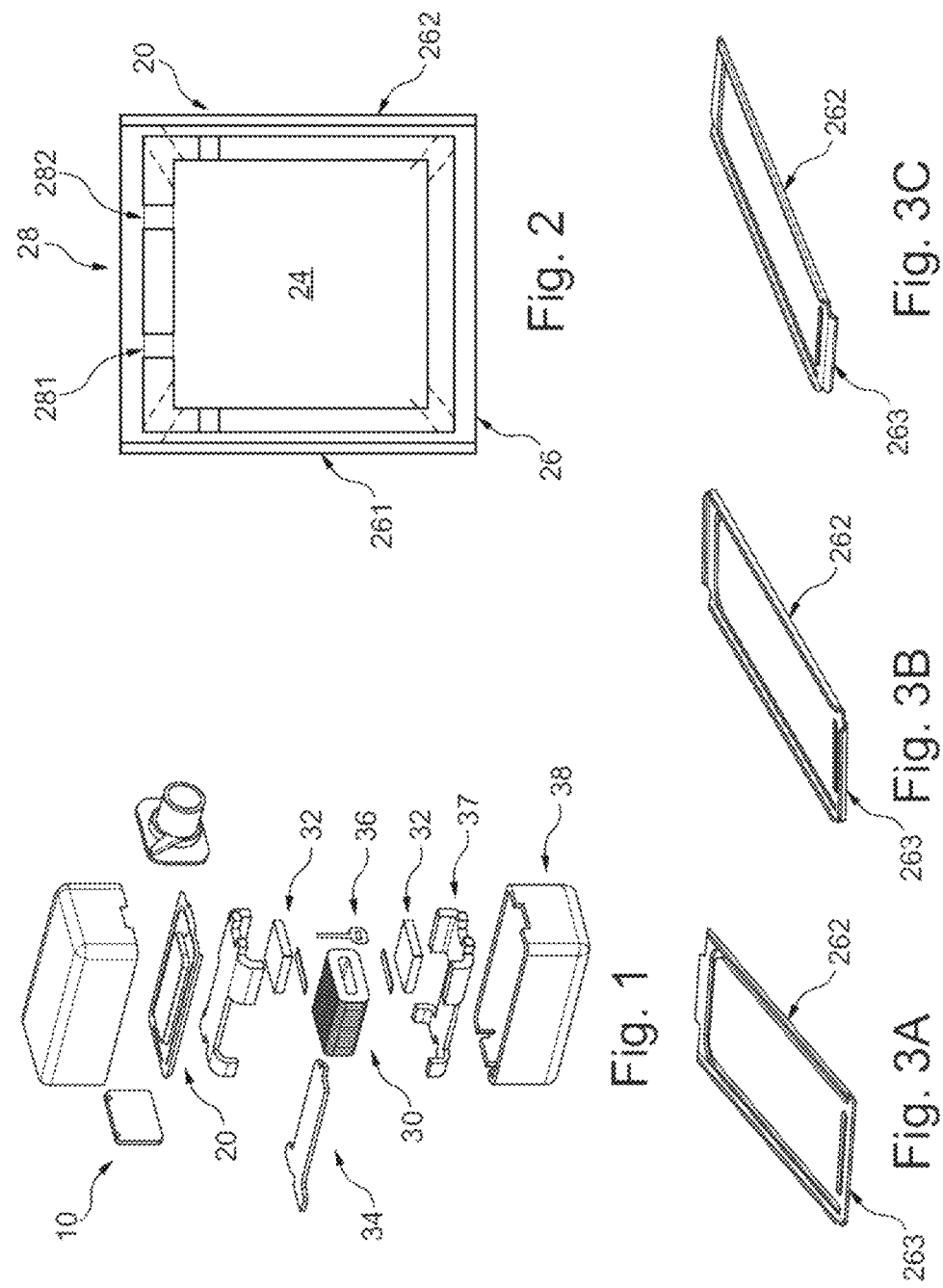

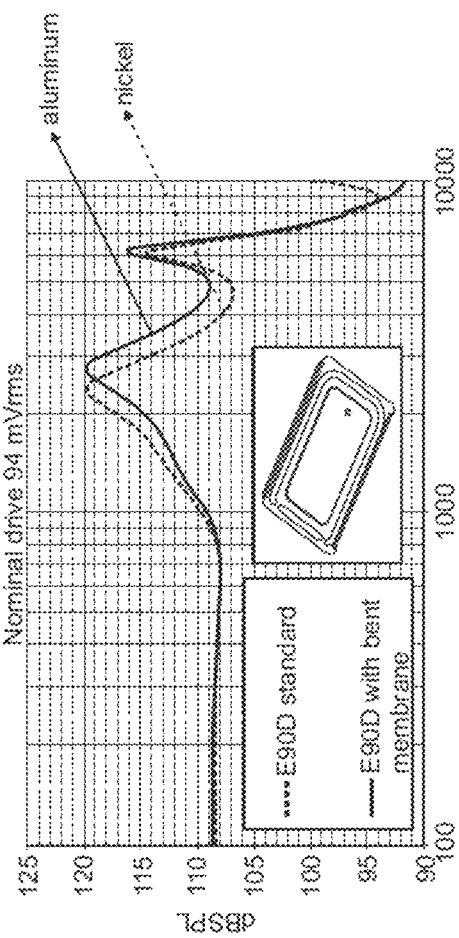
Fig. 4
Fig. 5
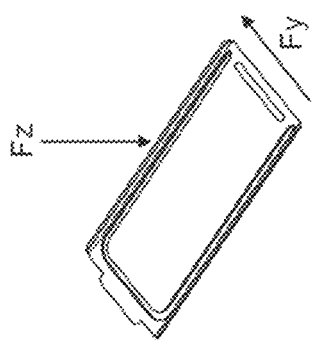

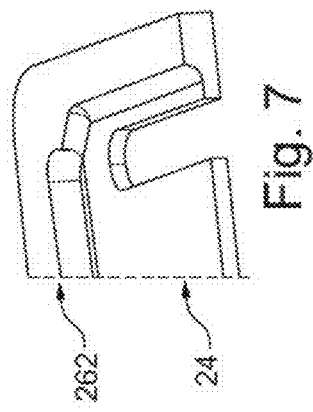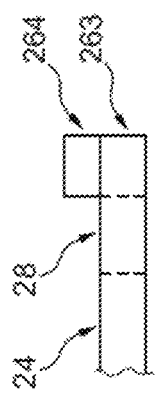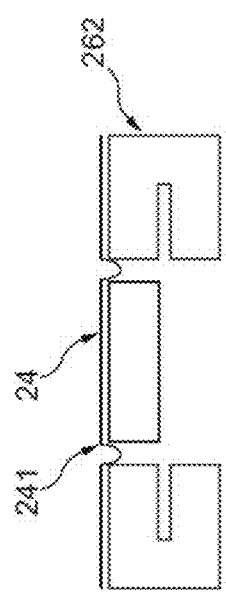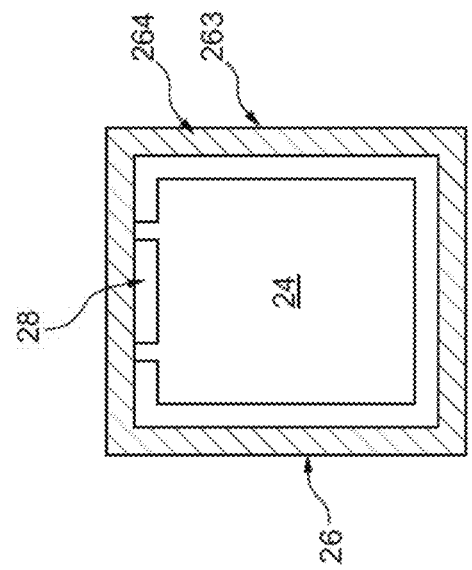
Fig. 6
Fig. 7
Fig. 8

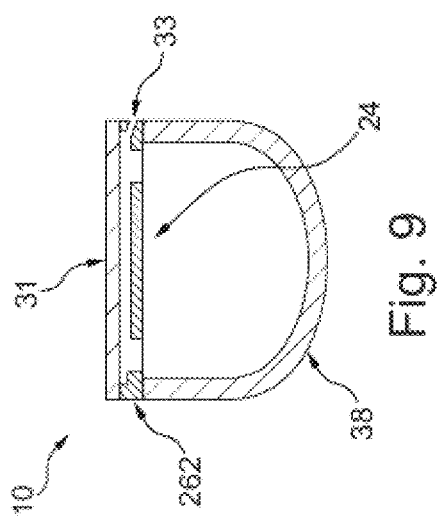
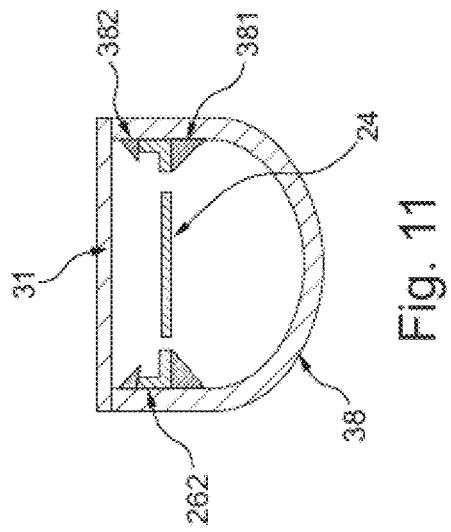
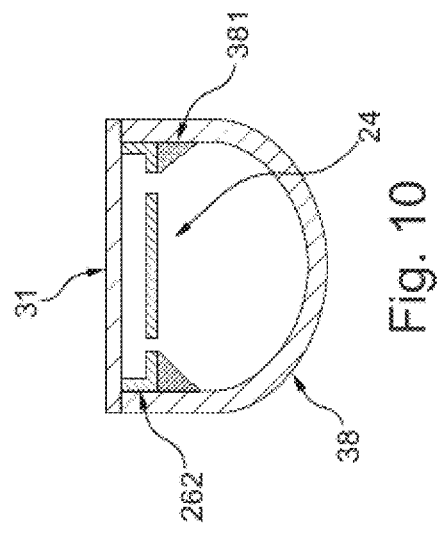
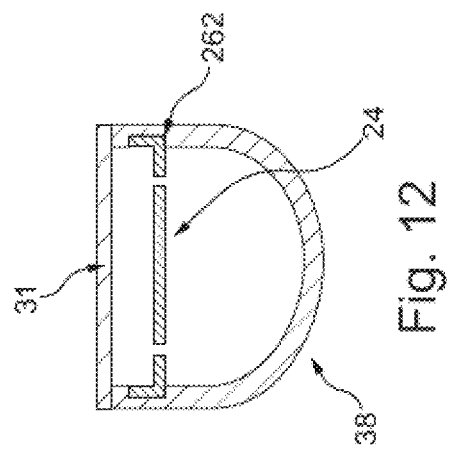

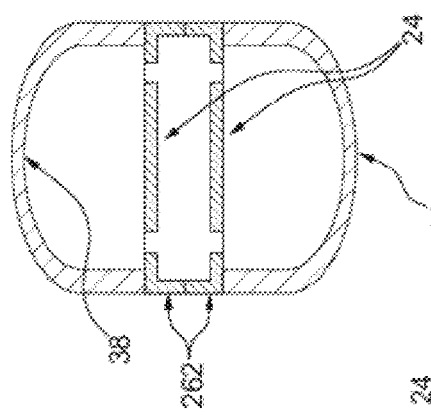
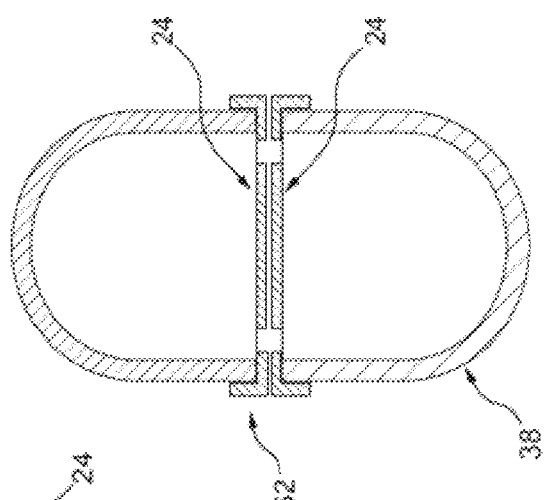
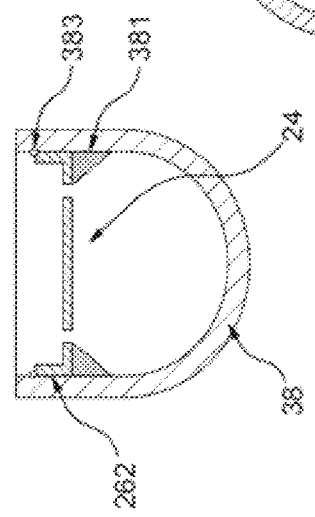
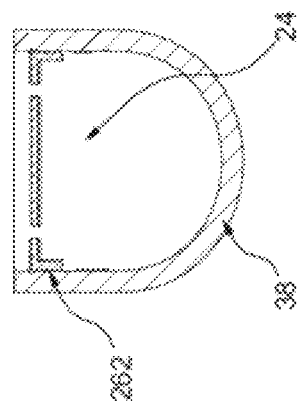

DIAPHRAGM ASSEMBLY, A TRANSDUCER, A MICROPHONE, AND A METHOD OF MANUFACTURE

CROSS-REFERENCE TO RELATED APPLICATIONS

This application is a continuation-in-part of U.S. patent application Ser. No. 16/725,469, filed Dec. 23, 2019, and claims the benefit of European Patent Application Serial No. 18248154.9, filed Dec. 28, 2018, both of which are incorporated herein by reference in their entireties.

FIELD OF THE INVENTION

The present application relates to a diaphragm element adapted to both sufficient audio performance and being sufficiently rugged to be handled during manufacture and assembly. More particularly, the invention relates to a diaphragm element with a sufficiently light movable element and a sufficiently rigid frame. This diaphragm element may then be used in a transducer/microphone to sense or output vibration/sound.

BACKGROUND OF THE INVENTION

Diaphragms and other movable elements may be seen in e.g. WO2018/106999, EP3342749, US20170006382, U.S. Pat. No. 6,404,897, US2003/099371, GB2306075, US2015222995, US2018027325, US2015373456, or EP application number 18191523.2, all of which are hereby incorporated by reference. In the prior art, a movable element of Aluminum is desired. However, a frame made of a plane sheet of Aluminum with the same thickness as the movable element is considered too fragile for miniature hearing devices. A sheet of Nickel, however, would be suitable for handling. Using an Aluminum paddle with a Nickel frame would, however, require glue acting as a connection element such as a hinge. Applying glue has a number of problems as the position and amount of the glue makes the connection vary too much as well as time consuming and resulting in a complicated and error-prone manufacturing.

SUMMARY OF THE INVENTION

In a first aspect, the invention relates to a diaphragm assembly for a miniature acoustical transducer comprising:
 a frame comprising therein an opening there through,
 a movable element disposed in the opening, and
 a connection element connecting the movable element to the frame,
 where the movable element:
 is made of a material being a metal or alloy having a Young's Modulus of 10-100 GPa and a density of 500-3000 kg/m$^3$ and
 has a first thickness in the interval of 3-50 µm, and
 where the connection element and frame comprises the material, the frame further comprising a stiffening element.

In general, what is desired is a movable element sufficiently light and stiff to allow good audio performance but at the same time a frame so stiff that it allows handling without permanent deformation. Such diaphragms must be efficient in order to be usable in miniature hearing devices, such as speakers to provide a maximum sound output in a confined output volume in a situation of personal hearing usage while having restricted size and power supply.

The present diaphragm assembly is particularly interesting in relation to miniature elements, such as for use in hearables or hearing aids.

In the present context, a miniature assembly is an assembly wherein the movable element has a maximum dimension of 10 mm or less, such as 5, 6, 7, 8 or 9 mm or less and/or a thickness of no more than 50 µm, such as no more than 45 µm, such as no more than 35 µm, such as no more than 25 µm, such as no more than 20 µm, such as no more than 10 µm, such as in the interval of 3-50 µm and/or in the interval of 5-50 µm.

A diaphragm assembly comprises a movable element attached to a frame. Usually, the frame defines therein an opening or hole in which the movable element is provided. Clearly, the frame need not fully circumscribe the movable element. The frame may be a portion provided at an outer circumference portion of the movable element. The frame usually is configured to be attached to or integrated in, such as by sandwiching between housing parts, a housing of a transducer in which the movable element is to be provided to be movable in relation to the housing.

The movable element may be rotatable in relation to the frame element. Alternatively, the movement may be a piston-like movement or a combination thereof, such as if a central portion of the movable element is to be translated perpendicularly to a plane of the movable element or frame and where outer portions of the movable element are attached to the frame.

In general, a gap may exist between the frame and movable element in order to ensure that the movable element may move in relation to the frame without hitting the frame. This impact could deteriorate the function of the diaphragm assembly. Clearly, this gap may have any width or dimensions. Often, the gap is desired as small as possible while ensuring its function. Thus, the gap may have a width being 10% or less, such as 3%, 4%, 5%, 6% or less of a width or smallest dimension of the movable element in the plane of the movable element.

Also, in general, an acoustical sealing element may be provided between the movable element and the frame in order to prevent, or at least significantly hinder, air or gas from passing between the movable element and the frame (and a connection elements such as a hinge), as this may deteriorate the acoustic properties of the diaphragm assembly. This flexible element may be in the form of a thin layer of e.g. a polymer allowing the movable element to move while maintaining the sealing properties. The layer may be a foil attached to the material of the movable element/frame before or after forming the moving element and frame.

Clearly, the connection element or hinge may form an integral portion of the frame and/or the movable element. No sharp boundary need exist between these elements. An elongate element attached at one end will bend if affected by a force at the opposite end. The portion closest to the attachment will thus be seen as a hinge.

In many situations, it is desired to define a connection element so that the bending/rotation takes place at a well-defined position. Thus, the connection element may be a softer or more bendable portion, such as a portion with a combined lower cross section or area/volume compared to that of the frame or movable element. In many situations, a connection element is formed by removing a portion of the frame or material closest to the movable element and/or portions of the movable element closest to the frame. In one situation, the movable element defines a plane and has a width in that plane, where the hinge is formed by elements in the plane, the hinge elements having a combined width, along the width of the movable element, being 50% or less, such as 40% or less, such as 30% or less, such as 20% or less, such as 10% or less than the width of the movable element.

Clearly, the hinge or connection element may be a rotational hinge as seen in doors, but often, the hinge is formed by a portion of the assembly which is desired to or designed to bend/deform/twist or the like to allow the frame and movable element to move in relation to each other.

The movable element may be allowed to be bendable during normal use. Alternatively, it may be desired that the movable element retains its shape to at least a defined degree (maximum bending allowed) and then move in relation to the frame primarily due to the operation of the hinge.

The movable element is made of a material being a metal or alloy having a Young's Modulus of 10-100 GPa, such as aluminum $70 \times 109$ Pa described in U.S. Pat. No. 6,404, 897B1 or suitable steel alloy and a density of 500-3000 $kg/m^3$, such as 1000-2900, such as 1500-2900, such as 2000-2800, such as 2500-2800 or 600-2500, such as 1000-2000 $kg/m^3$. A preferred material is aluminium. In fact even non-metallic materials may be used, such as a polymer material with mixed-in graphene particles. Materials of this type are sufficiently stiff to act as a diaphragm or paddle in a transducer where a movement, such as caused by a received pressure wave or sound, may be transferred to a sensing element or vice versa where a drive portion may move the movable element to cause vibration/sound.

In such situations, also the weight of the movable element is to be taken into consideration. In the present context, the movable element has a thickness in the interval of 3-50 µm, This thickness, combined with the stiffness and density allows the movable element to have the desired properties for use in a vibration/audio context.

According to the invention, the connection element or hinge and frame comprises the material. This has the advantage that the movable element may more easily be attached to, or even be integral with, the hinge and/or the frame. In some embodiments, the hinge and frame are made of the material.

According to the invention, the frame further comprises a stiffening element. As described above, materials of the type suitable for the movable element tend to, if provided in the same shape and thickness, be too fragile to be suitable in production and assembly. The stiffening element, as will be described in the following, may be provided in a number of manners.

In preferred embodiments, the Young's modulus of the frame is higher than that of the movable element, such as at least 110%, such as at least 125%, such as at least 150%, such as at least 175%, such as at least 200% of that of the material. The Young's modulus of the frame may be 125-500% of that of the material, such as 200-400% thereof. A Young's modulus of 150-300 GPa may be found suitable.

In a preferred embodiment, the movable element is an at least substantially plane element defining a plane. Naturally, the movable element may be embossed or coined. Embossing, for example, may be used for applying ridges or the like to the movable element to increase the stiffness thereof—such as along a particular direction.

Nevertheless, the movable element may define a plane. This plane may be that of outer portions of the movable element and/or a central portion thereof. Often, the movable element is configured to or intended to primarily move in directions perpendicular to this plane. Preferably, this embossing/coining does not alter the cross sectional area and shape, when projected on to the plane, of the moving element to any significant degree, such as no more than 5% or even no more than 1%. Also, it preferably does not alter the cross sectional thickness and/or adds material/weight to the paddle.

In this situation, the movable element may have the thickness in a direction perpendicular to the plane. Then, the frame may comprise a first portion made of the material and connected to the hinge. In this situation, the hinge and first portion may be integral, such as made from the same element. In this embodiment, the stiffening element may then be an element attached to the first portion. Clearly, the frame is made of the first portion and the stiffening element. Then, the first portion and the stiffening element may have the same cross section when projected on to the plane. Alternatively, the cross sections may be different but may, when combined, arrive at the desired cross section in the plane.

Thus when it is desired that the frame circumscribes the movable element when projected on to the plane, the first element may do this. Then, the stiffening element may overlap with the first element completely or partly. Alternatively, in this situation, the stiffening element may circumscribe the movable element when projected on to the plane where the first element then partly or completely overlaps with the stiffening element when projected on to the plane.

The stiffening element may be attached to the first portion in any desired manner, such as welding, gluing, hot melting, soldering or the like. Hot melting may be performed using a polymer, such as Poly Urethane as a connecting or gluing element. The stiffening element may be a solid element attached to or attachable to the first portion. Alternatively, the stiffening element may be applied to the first portion as a liquid or suspension.

The stiffening element may be desired primarily for handling purposes and thus provided only at positions at which handling is desired, such as a portion of an outer circumference of the frame. The stiffening element may not be desired or needed at other positions. Clearly, if a uniform thickness is desired of the frame, the stiffening element may be desired all along the periphery of the frame, or portions not provided with the stiffening element may be provided with other elements in order to arrive at a uniform thickness.

In one embodiment, the stiffness of the diaphragm assembly may be used for more than handling, such as for structural integrity or shape stability during use and after mounting in a housing. In one embodiment, one or more sides, such as two opposing sides, comprise the stiffening element so that they need not be supported when provided in a housing. Thus the other side(s) may be attached to the wall, such as provided between two housing parts, to fix the diaphragm in relation to the housing, where the side(s) with the stiffening element may not be themselves supported inside the housing. The side(s) attached to the wall need not have a stiffening element, as the wall may support these to ensure shape stability.

The stiffening element preferably is made of a material stiffer than that of the movable element. However, the mere adding of another element will add to the stiffness thereof. Thus, if the material is Aluminum, the stiffening element could be made also of Aluminum. However, also Steel or Nickel could be used, as could polymers, composite materials or the like. Other means of stiffening may be to provide a ceramic coating on the first portion.

Coatings of this type may be seen in e.g. U.S. Pat. No. 6,404,897. This coating may be provided separately on the first portion and optionally also on the moving element. If the coating is also undesiredly provided on the hinge, it may be removed using e.g. etching.

In addition, graphene particles or other types of particles may be added to the material in order to adapt the properties thereof. Materials of this type are described in e.g. US20170006382 and may be added to the frame and/or moving element. However, it may be desired that the hinge does not have such particles in order to remain compliant.

Clearly, the stiffening element may be provided with the desired shape before being attached to the first portion. Alternatively, a layer of the stiffening element may be attached to the material to form the moving element and at least a portion of the first portion and the hinge, where after portions of the layer of stiffening material may be removed, such as in the below-mentioned removal step, to form the final shape of the stiffening element.

In another situation, the frame and movable element, and optionally also the hinge, are made from the same sheet of the material. Then, the elements may be integral with each other, integral meaning that they are made of the same material and not attached to each other using e.g. gluing or welding.

Preferably, for each portion of the frame, movable element and hinge, the thickness is determined in a direction perpendicular to an outer surface of the portion.

In one embodiment, the movable element defines a plane and wherein the frame has inner portions, adjacent to the movable element, which extend at least substantially parallel with the plane, and outer portions, forming at least a portion of the stiffening element, which extend at an angle to the plane. Providing portions extending at a non-zero angle to the plane, such as perpendicular to the plane, will increase the overall stiffness of the frame.

In this context, the angle of the outer portions may be that between the plane and a second plane parallel to the outermost portions, especially in the situation where the outermost portions do not form a plane portion in themselves.

Then, the stiffening element may be formed by these elements extending at the angle to the plane. No additional elements are then required, and the layer thickness may be maintained and rather low while increasing the stiffness and thus make the assembly easier to handle during production and assembly. Clearly, the stiffness may be further increased by adding also a separate element and even more so, if the portions extending at the angle to the plane were made of a material stiffer than that of the movable element.

Clearly, the bend of the outer portions may be sharp or soft. The type of bend is not critical. Nor is the angle, which may be 90 degrees, more or less. Preferably, the angle is 10-180 degrees, such as 50-130 degrees, such as 60-120 degrees, such as 80-100 degrees. However, a 180 degrees angle is also interesting.

In one embodiment, the movable element defines a longitudinal direction, such as a longest side of a rectangular shape of the movable element (which may have rounded corners if desired), where the outer portions extend at least substantially parallel to the longitudinal direction. It may be desired to be able to grab the assembly along such longitudinal sides, so that this is where the stiffness is at least desired.

The hinge comprises the material. Preferably, the hinge is made of at least substantially the same material and has at least substantially the same thickness, so that the hinge may be made of the same sheet of material as that of the movable element and optionally also the first portion or the frame.

The hinge may be formed in a number of manners. For example, the hinge may be desired more flexible than the movable element. This may be achieved in a number of fashions, even when it is desired that the hinge and movable element are made of the same material and even monolithic or integrated. In one manner, a thickness of the hinge is reduced compared to the movable element. In another situation, the thickness of the hinge may be as that of the movable element but a width, such as an effective width, of the hinge may be reduced to provide the hinge with more flexibility than the movable element.

The hinge is provided in order to allow the movable element to move in relation to the frame. This movement may be a rotation along or around a desired axis. The hinge may be made of two portions parallel to each other and parallel to the axis so as to form torsional elements around which the movable element may rotate. In this situation, the hinge elements are typically provided on opposite sides of the moving element.

Alternatively, the hinge may be formed by two or more portions parallel to each other and perpendicular to the axis so that the movable element may rotate around the hinge elements as these bend. In this situation, the hinge portions are usually provided at one side of the moving element.

Other types of movement exist, such as a more piston-like movement where the movable element generally moves perpendicularly to a plane of e.g. the movable element (when in rest) or the frame. In this situation, the hinge may be formed by elements extending from the frame to the movable element and be able to bend or extend/contract to allow the piston-like movement. In this situation, the movable element may be made of a material which is able to bend, or dimensioned to allow this, in order to allow e.g. a central portion thereof, to obtain the movement perpendicular to the plane.

Another aspect of the invention relates to a transducer comprising a diaphragm assembly according to the first aspect as well as:
 a drive unit connected to the movable element and configured to move the movable element relative to the frame and
 a housing in which the diaphragm assembly is provided, the housing defining an inner space which is divided into two spaces by the diaphragm assembly.

Typical transducers generate sound or vibration by having the drive unit move the movable element. When the housing has a sound outlet, movement of the movable element will cause the air in the housing to move in the same manner and thus output pressure pulses from the sound outlet. Alternatively or additionally, the movable element may itself represent a mass, or an element may be attached thereto representing a sufficient mass, so that movement of the movable element causes a mass to move, causing vibration of the housing.

The transducer preferably is a miniature transducer, such as a transducer where the housing has a largest dimension, such as a largest length, of no more than 10 mm, such as no more than 8 mm, such as no more than 6 mm or no more than 5 mm. In one situation, the transducer housing may have a volume of no more than 100 mm$^3$, such as no more than 70 mm$^3$, such as no more than 50 mm$^3$, such as no more than 30 mm$^3$. Miniature transducers may be used in hearing aids, hearables or personal hearing devices, such as ear phones or the like.

Naturally, the drive unit may be based on any type of technology, such as Balanced Armature, using one or more piezo elements, moving coil, moving magnet or the like.

The function of the drive unit is to receive a signal, usually electrical, and convert this signal into a movement.

Often, the signal has frequency contents, where the movement, at least within a selected frequency interval, has at least the same frequency contents. Often, the movement is a translation along a predetermined direction.

The drive unit may be attached to the movable element, such as either directly or via an element, often called a drive pin. Typically, this attachment is as far away form the hinge as possible.

Often, the drive unit has a coil and a magnet where the coil receives an electrical signal which is converted into an electromagnetic field in an element which then is exposed to a magnetic field from the magnet and therefore moves in relation to the magnet. This movement will then correspond to the electrical field and will vary with a variation in the strength of the electromagnetic field.

At least the movable element is provided within the housing. Usually, the drive unit is also provided in the housing.

The housing defines therein two or more spaces or chambers. The movable portion takes place in defining at least two spaces. Usually, a surface portion of one space is defined by one side of the movable element and a portion of the other chamber is defined by an opposite side of the movable element.

As mentioned, the transducer may be configured to output sound through a sound output which will then exist through the housing from one chamber to surroundings thereof. Also, a so-called vent may exist between the other chamber and the first chamber and/or the surroundings in order to allow pressure equalization of this second chamber.

In one situation, the complete diaphragm assembly is provided inside the housing. This may be when, e.g. the housing has an inner ledge on which the diaphragm assembly rests. The ledge may be an element attached to an inner surface of the housing or a recess formed in a wall of the housing.

In general, the housing may comprise a first and a second housing part, so that the diaphragm assembly and optionally also the drive unit may be positioned as desired in or in relation to one housing part, where after the other housing part is provided to complete the housing. The housing preferably is sealed to allow air transport only via a sound output, if provided. Thus, the housing parts may seal to each other.

Alternatively, the diaphragm assembly may extend between the housing parts so that the first and second housing parts engage opposite sides of the diaphragm assembly. Then, to obtain the sealing, the first and second housing parts may engage the diaphragm assembly in a sealing manner along a periphery of the diaphragm assembly and/or the housing parts.

In one situation, one housing part is plane or at least substantially plane. Thus, it may be desired to provide a further element between this housing part and the diaphragm element in order to provide a distance between the movable element and the housing part to allow the moving element to move without impacting on the plane housing part. This further element may be provided at the frame or outside of the frame and not at the movable element when projected on to the plane.

Naturally, the above-mentioned diaphragm assembly having outer portions extending at an angle to the plane of the movable element may also be used in the present transducer. In this situation, the bent or outer portion(s) may form the above further element, as they may provide a desired distance between the movable element (in its rest position) and the plane housing part.

In one embodiment, the diaphragm assembly has a first and a second pair of opposing sides of which the sides of the first pair comprise the stiffening element, such as are bent at least substantially 90 degrees. This diaphragm assembly may be provided in the housing so that the sides of the first pair of sides are not attached to the housing. A biasing may be provided, but the first pair are not glued, welded, soldered or the like to the housing, nor is an edge provided for them to be supported on.

The sides of the second pair are supported by the housing, such as fixed to the housing. In one embodiment, the housing is provided using at least two housing portions, where the sides of the second pair are each provided between two housing portions such as to be fixed to the housing portions by engagement with the housing portions. The sides of the second pair may be attached to the housing portions by gluing, welding, soldering thereto or by being squeezed between opposite housing portions.

A third aspect of the invention relates to a microphone comprising a diaphragm assembly according to the first aspect of the invention as well as:
  a sensor unit connected to the movable element and configured to sense movement of the movable element relative to the frame and
  a housing in which the diaphragm assembly is provided, the housing defining an inner space which is divided into two spaces by the diaphragm assembly.

A microphone may have the same overall elements and structure and the transducer, the only difference being that the microphone senses vibration/sound where the transducer outputs these. Thus, the sensing unit may be of any of the types mentioned for the drive unit, and the housing may comprise the elements mentioned above, where the sound outlet now is replaced by a sound inlet.

The microphone preferably is a miniature microphone, such as a transducer where the housing has a largest dimension, such as a largest length, of no more than 10 mm, such as no more than 8 mm, such as no more than 6 mm. or no more than 5 mm. In one situation, the microphone housing may have a volume of no more than 100 $mm^3$, such as no more than 70 $mm^3$, such as no more than 50 $mm^3$, such as no more than 30 $mm^3$. Miniature microphones may be used in hearing aids, hearables or personal hearing devices, such as ear phones or the like.

Thus, the housing may have the above inner ledge on which the diaphragm assembly rests.

Also, the housing may comprise the above first and a second housing parts which may engage each other or the diaphragm assembly in a sealing manner along a periphery of the diaphragm assembly and/or the housing parts.

Furthermore, the diaphragm assembly may have outer portions extending at an angle to a plane of the movable element, and these may be used for defining a distance between the two housing parts. Alternatively, a separate element may be provided as described.

A fourth aspect of the invention relates to a method of manufacturing the diaphragm assembly according to the first aspect, the method comprising:
  providing a sheet of the material and with the thickness and
  removing a portion of the material to form the movable element and the hinge.

In this aspect, a sheet is an element which has a shape which is much larger, such as at least a factor of 10, along two directions, perpendicular to each other, than a third direction, defining the thickness, perpendicular to the two directions. Often, the sheet has a length (longest dimension)

and a width. Sheets may be provided in rolls if sufficiently bendable without breaking. Usually, sheets have at least the same thickness over all of the surface thereof. The sheet usually has two opposing main surfaces.

Clearly, the method may actually comprise providing the material with a higher thickness and then removing material at the movable element to provide the movable element with the desired, lower thickness. Then, the frame may have the original thickness or a thickness between that of the original sheet and that of the movable element. This provides a frame with an increased thickness and of the same material.

Clearly, the material may be provided with the desired thickness by milling/coining, rolling or the like, if the sheet at the beginning is too thick. Also, the initial sheet may need adaptation, such as removal of an outer layer to arrive at a desired thickness or surface.

The removal step may use any type of removal, such as laser cutting, ablation, etching, milling, cutting, or the like. The removal may be removing part of the material all through the thickness thereof to make a gap. Alternatively or additionally, material may be removed only partly through the thickness to arrive at portions with a lower thickness. This may be in order to make that portion more bendable while preventing air from moving from one side of the movable element to the opposite side thereof.

The removal step may result in the formation of a gap between the movable element and the frame. The hinge may also be generated by removing material at this position. The hinge may be made by reducing the thickness of the material at the position of the hinge. Alternatively or additionally, the hinge may be defined as narrower portions extending from the frame to the movable element.

In one embodiment, the method further comprises the step of attaching an element to the sheet, before or during the removal step, the element forming, with a portion of the layer, the frame. This element then may form the stiffening element mentioned above. As mentioned, this element may be made of any material, and the attachment may be obtained in any manner.

In another embodiment, the method further comprises the step of, before or during the removal step, bending outer portions of the sheet, forming the frame, to obtain a non-zero angle to a plane of the movable element. These outer portions may form, apart from the bent portion, a plane portion. Alternatively, the outer portions may be rounded, such as to form a curved portion.

Another aspect of the invention relates to a method of manufacturing a transducer according to the second aspect of the invention, the method comprising:
providing the diaphragm assembly,
positioning the diaphragm in the housing and attaching the movable element to the drive unit.

A final aspect of the invention relates to a method of manufacturing a microphone according to the fourth aspect of the invention, the method comprising:
providing the diaphragm assembly,
positioning the diaphragm in the housing and attaching the movable element to the sensor unit.

BRIEF DESCRIPTION OF THE DRAWINGS

In the following, preferred embodiments of the invention will be described with reference to the drawing, wherein:
FIG. 1 illustrates a transducer or a microphone comprising a diaphragm assembly according to the invention,
FIG. 2 illustrates an embodiment of the diaphragm assembly according to the invention,
FIG. 3A-C illustrate embodiments of the diaphragm assembly according to the invention,
FIG. 4 illustrates the stiffness increase caused by bent frame portions
FIG. 5 illustrates the difference between a Nickel paddle and an Aluminum paddle,
FIG. 6 illustrates another embodiment of an assembly according to the claim,
FIG. 7 illustrates an alternative embodiment of the assembly of the invention,
FIG. 8 illustrates an embodiment with a stiffening element attached to the remainder of the frame,
FIG. 9 illustrates a first manner of fitting a diaphragm assembly within a case,
FIG. 10 illustrates another manner of fitting a diaphragm assembly within a case,
FIG. 11 illustrates another manner of fitting a diaphragm assembly within a case,
FIG. 12 illustrates another manner of fitting a diaphragm assembly within a case,
FIG. 13 illustrates another manner of fitting a diaphragm assembly within a case,
FIG. 14 illustrates a manner of fitting a diaphragm assembly to a case,
FIG. 15 illustrates a dual transducer where the bent portions define the distance between the paddles,
FIG. 18 is a cross section of the embodiment of FIG. 17.

DETAILED DESCRIPTION OF THE INVENTION

Figure 16:
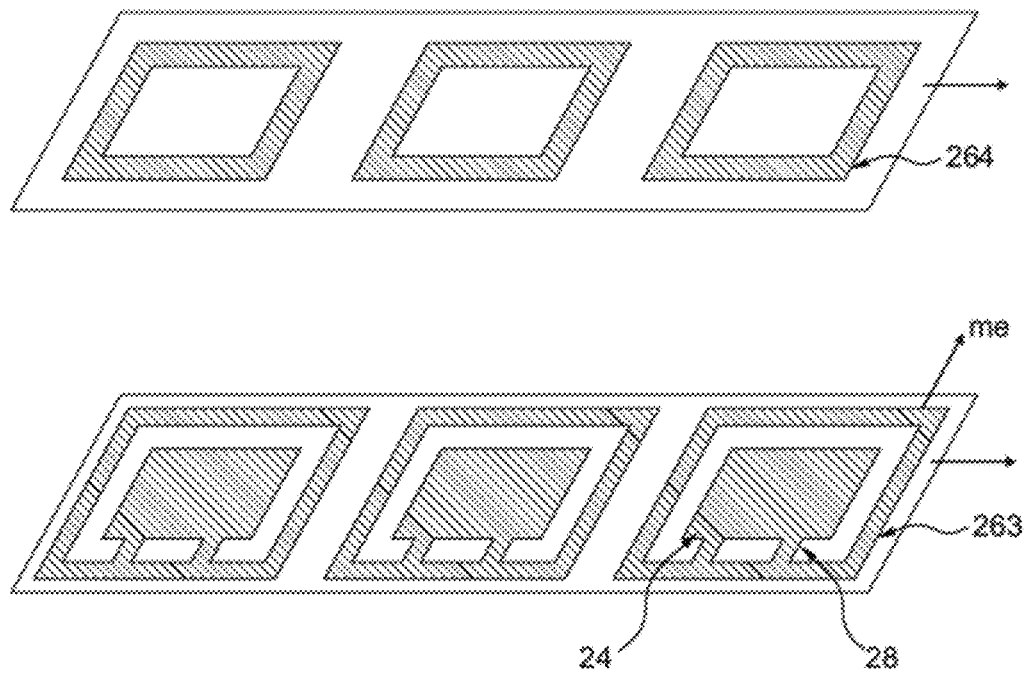
FIG. 16 illustrates manufacture of the embodiment of FIG. 8.

In FIG. 1, a transducer or microphone 10 is illustrated comprising a diaphragm assembly 20 according to the invention. As usual, a drive unit may be used as a sensor unit. This merely has to do with whether sound is to be received or generated. In the following, the transducer will be described, but a microphone may be made with the same components only which does not receive a signal to feed a drive unit but has a sensor unit outputting a signal instead.

The drive unit has a coil 30, a magnet 32 and an armature 34 extending through the coil and magnetic field to convert a received current into up/down movement. The drive armature 34 is connected to the movable portion 24 (see FIG. 2) via a drive pin 36.

The electromagnetic fields may be contained and guided in the housing 38 by an inner shielding housing 37 if desired. A back portion and a sound output spout may be provided. At the top of the drawing, the assembled transducer may be seen with a slightly transparent outer housing 38.

The diaphragm assembly 20 divides the inner space of the housing 28 into two chambers. The sound entrance opens into one of the chambers so that sound entering that chamber will move the movable portion 24 (see FIG. 2) of the diaphragm assembly.

Clearly, it may be desired to ensure that air cannot pass between the paddle and frame. Thus a resilient material (241—see FIG. 6) may be provided in the gap between the frame and paddle (and hinge) to prevent such air from passing from one chamber to the other.

The diaphragm assembly 20 is illustrated in further detail in FIG. 2, where a movable portion 24 is provided within a frame 26 and connected thereto via a hinge 28 comprising, in this example, two hinge portions 281 and 282.

Preferably the hinge portions extend parallel to each other so as to allow the movable portion to move in relation to the frame by rotation of and/or around the hinge portions—without the movable portion deforming to any undesired degree. Instead of the positions of the portions 281/182, alternative positions are indicated in vertical lines. In a further embodiment, the paddle is not vibrated along/around an axis defined by the hinge portions but is actuated from a centre thereof (or another position thereof). In this situation, the hinge portions may be at corners thereof (such as all corners thereof) as indicated by hatched lines.

The hinge interconnects the frame 26 and the movable element or paddle 24.

The properties desired in the individual portions of the assembly 20 are conflicting. The paddle 24 is desired light and relatively stiff. A preferred material for the paddle 24 is Aluminum. The frame 26 is desired rather stiff, preferably stiffer than the material of the paddle 24, as handling of the assembly 20 is otherwise too difficult. If the frame was made of a plane sheet of aluminium with the same thickness as that of the paddle 24, handling of the frame may easily deform or break the frame. Thus, a more rigid material is desired for the frame. A usual material for the frame is Nickel.

The hinge is desired flexible but primarily integral with the paddle and frame. Hitherto, when the paddle and hinge are of different materials, hinges have been made using glue interconnecting the paddle and the frame. Glue, however, is difficult to apply at the correct position and in the correct amount. Thus, the hinge is inferior to a hinge integral with the paddle and frame.

Therefore, the preferred material of the hinge may be that of the paddle, so that the hinge may be integral with the paddle. Then, if the material of the hinge was also the same as that of the frame, the hinge could be integral with both the paddle and the frame. This would also facilitate manufacture of the assembly, as the hinge, frame and paddle could be made simply by removing the portion of the material between these elements.

This, however, brings about the problem of the desired stiffness of the frame.

A number of solutions exist to this problem.

In FIG. 2, the outermost edges of the longitudinal frame portions 262 have been bent out of the plane defined by the paddle and the innermost portions of the frame (and the hinge). The shorter sides 263 are not bent in this embodiment. Bending the outermost portions of the frame material will make these portions stiffer compared to the plane version of the same material.

The stiffness increase is of the type also taken advantage of in I- and T-beams in buildings.

In FIG. 3A, this solution is also illustrated where the long sides 261 and 262 of the frame are stiffened by bending the outermost portions. In this embodiment, the bending is to a 90 degrees angle, but other angles may be useful.

In FIG. 3B, all 4 straight sides are bent. The frame may have an outer periphery with rounded corners (as may the paddle), so that the rounded portions may not be bent. Also, other or fewer portions of the frame may be bent. Clearly, the handling of a stiffened frame will be much easier with a much lower possibility of deforming or destroying the frame and thus the assembly.

In FIG. 3B, the bent portions are bent in the same direction or to the same side of the plane defined by the paddle. In FIG. 3C, the longitudinal edge portions 262 are bent to one side and the shorter sides 263 to the other side. This gives the same advantages but may be preferred when assembling the transducer (see further below).

The effect of the bending is seen in FIG. 4 when the diaphragm assembly is of the type illustrated in FIGS. 2 and 3A compared to an assembly with plane (non-bent) frame portions and made of different materials. The stiffness of the frame is determined along two directions: the y direction in the plane and perpendicular to the long sides, and the z direction perpendicular to the plane of the paddle. Table 1 illustrates the stiffness of the bent/plane assemblies for Aluminum and Nickel, respectively. It is recaptured that the preferred characteristics of the paddle are as those of Aluminum (light and relatively stiff), where the preferred stiffness of the frame is closer to that of Nickel with the same thickness as a preferred Aluminum paddle.

It is seen that the stiffnesses (N/m) of the flat Aluminum frame are lower than those of the bent Aluminum frame. The same of course is the situation in the Nickel frame. It is seen, however, that the stiffness, in the z direction, of the bent Aluminum frame is higher than that of a flat Nickel frame. Thus, the desired characteristics may be obtained using Aluminum and bending the frame. As mentioned, providing the paddle, hinge and frame of the same material is highly desired—especially, if they may be made of the same thickness, such as from a sheet of the material.

Clearly, if different properties are sought for the paddle, such as a higher stiffness or even lower weight, another material or another thickness may be desired, which again will require the stiffening of the frame (when made of the same material and thickness) in order to arrive at an assembly which will not break during handling.

FIG. 5 compares the characteristics of a nickel paddle and an aluminium paddle with the same dimensions. Clearly, the properties of the aluminium paddle are more preferable—due to the lower mass thereof.

In the paddle of FIG. 5, an embossing is seen. Embossing of this type aids in stiffening the paddle without altering the weight or other dimensions thereof. Other types of deformation may be used, such as coining, which have the same effect. Thus, the properties of also the paddle may be adapted—but without adding material or weight thereto.

In FIG. 6, a diaphragm assembly is illustrated in which the outer portions 262 are not bent 90 degrees but closer to 180 degrees. Again, this increases the stiffness of the frame. In this situation, the stiffness increase is obtained more due to the increased thickness of the material of the frame.

In FIG. 7, an embodiment is seen in which the thickness increase of the frame is arrived at in another manner. In this embodiment, the frame has a higher thickness due to material having been removed at the paddle. Material may also be removed from the hinge in order to arrive at a sufficiently flexible hinge. Naturally, the resulting thicknesses of the paddle and hinge may be different or the same.

The material removal process may be sputtering or etching—or any type of working, such as coining, milling or the like.

Then, the assembly may be made of a sheet of material with a thickness as that (or thicker) of the frame, where material is then removed to arrive at the desired thickness of the paddle and hinge.

Naturally, the initial material may be a laminate with two or more layers, where one or more top layers are removed at the paddle and/or hinge whereas some of those layers may remain in the frame portion. Thus, in this manner, a hybrid element as is also described in relation to FIG. 8 may be arrived at.

In FIG. 8, a further alternative embodiment is seen where the stiffer frame is arrived at by attaching an outer portion to the frame. The embodiment is also seen from the side, from which it is clear that the paddle and hinge are made of a thinner material which extends also to the frame—as the portion 263. On to this portion 263 is attached a portion 264 which then makes the overall frame more rigid than the portion 263 alone.

Again, the advantage is seen that the paddle and hinge may be integral with each other and the hinge integral with the portion 263 and thus the frame.

FIG. 16 illustrates the manufacture of an assembly of this type, where a sheet or band with the stiffening elements 264 is merged with a sheet or band with the paddle 24, connection elements such as a hinge 28 and portion 263. The hinge may be connected to the same side of the portion 263 or the two elements of the hinge may be connected to opposite sides of the portion 263 (not shown). The paddle, hinge and portion 263 need not be formed or separate from each other but may be formed once the two sheets are merged. Also, the upper sheet may be a complete sheet, where a portion thereof is removed in order to form the stiffening elements 264. In that case, this removal may take place before any removal of portions of the lower sheet to form the paddle, hinge and portion 263.

Alternatively, one sheet may have the frame with stiffening elements 264, and another sheet may have only the paddle 24 and the hinge 28 without the portion 263. When sheets are merged, the hinge 24 is connected to the frame with the stiffening elements 264 and the paddle 24. Slightly different materials may be used in both sheets in order to optimize the acoustical performance of the paddle while the frame is made stiffer. Alloys and/or graphene composites may be used. In yet another embodiment, one sheet may have the frame with stiffening elements 264 and the hinge 28 without the portion 263, and another sheet may have only the paddle 24.

There are no limits to the type of material of the element 264. The material may be identical to that of the paddle or different thereto. The material of the element 264 may be another metal/alloy or a hybrid material, such as a polymer or metal/alloy with added graphene fibres, ceramic particles or the like. The properties of such materials may be tailored and even be directed so that the bending stiffness is higher in one direction compared to another direction.

As mentioned, the assembly without the portion 264 may be too fragile, so it may be desired to attach the portion 264 to a sheet of material before removing the portions between the frame and paddle and thus form the paddle and hinge. In this manner, the assembly is not handled before the portion 264 is attached.

This attachment may be of any desired type, such as gluing, hotmelt, welding, soldering, any bonding method, or the like.

Then, the overall stiffness of the frame may be fully detached from the parameters of the paddle and hinge. The stiffness of the frame may, when the material and thickness has been selected for the paddle and hinge, be optimized by selecting a material and thickness of the other material.

In FIG. 9, a transducer (could also be a microphone) 10 is illustrated in which a diaphragm assembly 20 is provided. The transducer has a housing formed by a hollow case 38 and a flat cover 31. Usually, the transducer will have a sound outlet 33 through which sound can escape.

A space is defined by the case 38 and the cover 31, and this space is divided into two chambers by the diaphragm assembly 20. The sound outlet opens into one of the chambers.

In this embodiment, the frame is fitted between the upper edge of the case 38 and the lower edge of the cover 31. The sound outlet is provided in the frame, such as as a cut-out of a portion of the frame.

The drive portion of this transducer is not illustrated but may be provided inside the case 38 below the paddle 24.

In FIG. 10, the assembly 20 is provided inside the space between the case and the cover. The outer portions 262 of the frame rest on a cam 381 attached to the inner surface of the case 38. The cam may assist in ensuring an airtight seal between the assembly 20 and the case.

In FIG. 11, an upper cam or seal 382 is provided for fixing the assembly 20 to the case and/or ensuring the seal.

In FIG. 12, the fastening of the assembly 20 in the space may be achieved by press-fitting the frame in the space. Alternatively, a cut-out may be provided in the frame 38 into which the frame may click or fit.

In FIG. 13, the upper cam is replaced by a weld 383.

In FIG. 14, another manner of attaching the assembly 20 to the case 38 is seen. The assembly 20 may be made so wide, that the bent portions 262 may extend on the outer side of the case 38. In this manner, positioning of the assembly relative to the casing is rather easy. Then, another case or a lid may be attached to the upper side of the assembly 20 so as to seal the transducer.

In FIG. 15, a further embodiment is seen, of the type seen in FIG. 9, where the bent portion is provided between the case and the lid. In this embodiment, two assemblies 20 are provided with the bent portions directed toward each other and combined forming a seal between two cases 38.

In this embodiment, the bent portions 262 may form the additional task of defining a distance between the paddles 24. Clearly, it is not desired that the paddles touch.

Then, two drive portions may be provided, one in each case, for arriving at a dual transducer.

Figure 17:
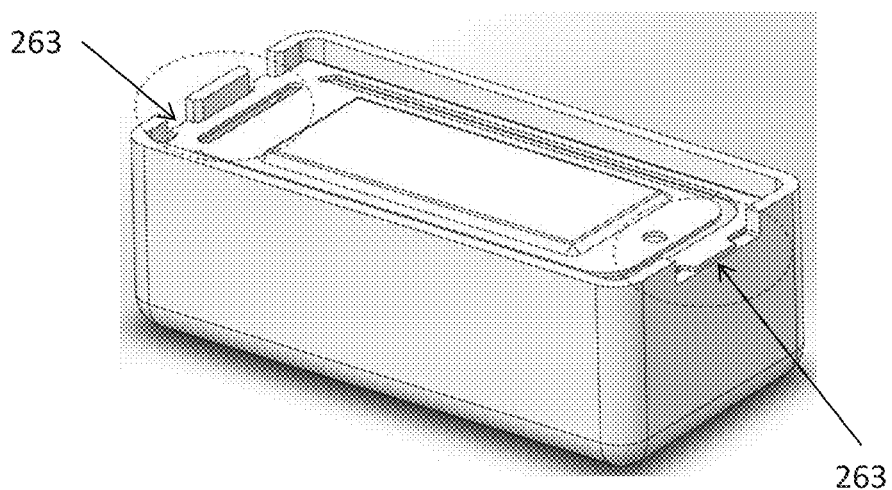
FIG. 17 illustrates an embodiment with stiffer longer portions.

In FIG. 17, an embodiment is illustrated where the long sides 262 are bent downwardly (see the cross section of FIG. 18) and where the short sides 263 are straight, and thus not as stiff, and are provided into openings in the housing portions. The short sides 263 then are attached to the housing when the housing halves are assembled, as the short sides 263 are squeezed between the housing halves. Alternatively, these sides may be glued/welded/soldered to the housing or be allowed to rest on ledges as described above.

The two long sides 262 are unsupported in the housing, as they are sufficiently stiff to maintain their shape both during manufacture and during use. Then, elements or production steps are not required for fastening these to the housing. A biasing may be provided between these sides and the housing both to maintain their positions but also to prevent air from passing around the sides from one side of the diaphragm to the other.

Naturally, the above resilient material 241 may be provided as always. This material may be allowed to be provided between the long sides 262 and the housing to seal against air transport between the long sides and the housing.

It is noted that the stiffening in general allows the frame of the diaphragm assembly to be narrower, in the plane of the diaphragm, which in turns allows the movable portion to be larger, which allows a larger sound output for the same overall dimensions of the diaphragm assembly.

The invention claimed is:

1. A diaphragm assembly for a miniature acoustical transducer comprising:
 a frame comprising therein an opening there through,
 a movable element disposed in the opening, and
 a hinge connecting the movable element to the frame, where the movable element:
is made of a material being a metal or alloy having a Young's Modulus of 10-100 GPa and a density of 500-3000 kg/m$^3$ and
has a first thickness in the interval of 3-50 μm,
where the hinge and frame comprises the same material, the frame further comprising a stiffening element.

2. A diaphragm assembly according to claim 1, wherein the movable element is an at least substantially plane element defining a plane.

3. A diaphragm assembly according to claim 2, wherein the movable element has the thickness in a direction perpendicular to the plane, the frame comprising a first portion made of the material and connected to the hinge, and where the stiffening element is an element attached to the first portion.

4. A diaphragm assembly according to claim 2, wherein the frame and movable element are made of the same sheet of the material, the sheet having the first thickness.

5. A diaphragm assembly according to claim 1, wherein, for each portion of the frame, movable element and hinge, the thickness is determined in a direction perpendicular to an outer surface of the portion.

6. A diaphragm assembly according to claim 5, wherein the movable element defines a plane and wherein the frame has inner portions, adjacent to the movable element, which extend at least substantially parallel with the plane, and outer portions, defining the stiffening element, which extends at an angle to the plane.

7. A diaphragm assembly according to claim 6, wherein the movable element defines a longitudinal direction, where the outer portions extend at least substantially parallel to the longitudinal direction.

8. A diaphragm assembly according to claim 1, wherein the hinge is made of at least substantially the same material and has at least substantially the same thickness.

9. A transducer comprising a diaphragm assembly according to claim 1 as well as:
a drive unit connected to the movable element and configured to move the movable element relative to the frame and
a housing in which the diaphragm assembly is provided, the housing defining an inner space which is divided into two spaces by the diaphragm assembly.

10. A microphone comprising a diaphragm assembly according to claim 1, as well as:
a sensor unit connected to the movable element and configured to sense movement of the movable element relative to the frame and
a housing in which the diaphragm assembly is provided, the housing defining an inner space which is divided into two spaces by the diaphragm assembly.

11. A method of manufacturing the diaphragm assembly according to claim 1, the method comprising:
providing a sheet of the material and with the thickness and
removing a portion of the material to form the movable element and the hinge.

12. A method according to claim 11, further comprising the step of attaching an element to the sheet, before or during the removal step, the element forming, with a portion of the sheet, the frame.

13. A method according to claim 11, further comprising the step of, before or during the removal step, bending outer portions of the sheet, forming the frame, to obtain an angle to a plane of the movable element.

14. A method of manufacturing a transducer according to claim 9, the method comprising:
providing the diaphragm assembly,
positioning the diaphragm in the housing and attaching the movable element to the drive unit.

15. A method of manufacturing a microphone according to claim 10, the method comprising:
providing the diaphragm assembly,
positioning the diaphragm in the housing and attaching the movable element to the sensor unit.

16. A diaphragm assembly for a miniature acoustical transducer comprising:
a frame comprising therein an opening there through,
a movable element disposed in the opening, and
a hinge connecting the movable element to the frame,
where the movable element:
is an at least substantially plane element defining a plane,
is made of a material being a metal or alloy having a Young's Modulus of 10-100 GPa and a density of 500-3000 kg/m$^3$ and
has a first thickness in the interval of 3-50 μm in a direction perpendicular to the plane,
where the hinge and frame comprises the material, the frame further comprising:
a first portion made of the material and connected to the hinge; and
a stiffening element attached to the first portion.

17. A transducer comprising a diaphragm assembly for a miniature acoustical transducer, the diaphragm assembly comprising:
a frame comprising therein an opening there through,
a movable element disposed in the opening, and
a hinge connecting the movable element to the frame,
where the movable element:
is made of a material being a metal or alloy having a Young's Modulus of 10-100 GPa and a density of 500-3000 kg/m$^3$ and
has a first thickness in the interval of 3-50 μm,
where the hinge and frame comprises the material, the frame further comprising a stiffening element,
the transducer further comprising:
a drive unit connected to the movable element and configured to move the movable element relative to the frame, and
a housing in which the diaphragm assembly is provided, the housing defining an inner space which is divided into two spaces by the diaphragm assembly.

18. A microphone comprising a diaphragm assembly for a miniature acoustical transducer, the diaphragm assembly comprising:
a frame comprising therein an opening there through,
a movable element disposed in the opening, and
a hinge connecting the movable element to the frame,
where the movable element:
is made of a material being a metal or alloy having a Young's Modulus of 10-100 GPa and a density of 500-3000 kg/m$^3$ and
has a first thickness in the interval of 3-50 μm,
where the hinge and frame comprises the material, the frame further comprising a stiffening element,
the microphone further comprising:
a sensor unit connected to the movable element and configured to sense movement of the movable element relative to the frame, and
a housing in which the diaphragm assembly is provided, the housing defining an inner space which is divided into two spaces by the diaphragm assembly.

19. A method of manufacturing the diaphragm assembly for a miniature acoustical transducer, the diaphragm assembly comprising:
- a frame comprising therein an opening there through,
- a movable element disposed in the opening, and
- a hinge connecting the movable element to the frame,
- where the movable element:
- is made of a material being a metal or alloy having a Young's Modulus of 10-100 GPa and a density of 500-3000 kg/m$^3$ and
- has a first thickness in the interval of 3-50 μm,
- where the hinge and frame comprises the material, the frame further comprising a stiffening element,
- the method comprising:
- providing a sheet of the material and with the thickness,
- removing a portion of the material to form the movable element and the hinge, and
- either attaching an element to the sheet, before or during the removal step, the element forming, with a portion of the sheet, the frame, or, before or during the removal step, bending outer portions of the sheet, forming the frame, to obtain an angle to a plane of the movable element.

\* \* \* \* \*